(12) United States Patent
Hensel et al.

(10) Patent No.: US 7,754,009 B2
(45) Date of Patent: Jul. 13, 2010

(54) UNPOLISHED SEMICONDUCTOR WAFER AND METHOD FOR PRODUCING AN UNPOLISHED SEMICONDUCTOR WAFER

(75) Inventors: Wolfgang Hensel, Burghausen (DE); Rudolf Lehner, Trostberg (DE); Helmut Schwenk, Burghausen (DE)

(73) Assignee: Siltronic AG, Munich (DE)

( * ) Notice: Subject to any disclaimer, the term of this patent is extended or adjusted under 35 U.S.C. 154(b) by 876 days.

(21) Appl. No.: 11/528,861

(22) Filed: Sep. 28, 2006

(65) Prior Publication Data

US 2007/0072423 A1 Mar. 29, 2007

(30) Foreign Application Priority Data

Sep. 29, 2005 (DE) .................. 10 2005 046 726

(51) Int. Cl.
*H01L 21/302* (2006.01)

(52) U.S. Cl. .................... 117/13; 117/928; 117/931; 117/932; 438/689; 438/690; 438/691; 438/692

(58) Field of Classification Search .............. 117/13, 117/928, 931, 932; 438/689, 690, 691, 692
See application file for complete search history.

(56) References Cited

U.S. PATENT DOCUMENTS

| | | | | |
|---|---|---|---|---|
| 4,193,783 A * | 3/1980 | Matsushita | .................. | 65/31 |
| 5,227,339 A | 7/1993 | Kishii | | |
| 5,360,509 A * | 11/1994 | Zakaluk et al. | ............ | 117/106 |
| 5,899,744 A | 5/1999 | Toyama et al. | | |
| 6,063,301 A | 5/2000 | Kiwada et al. | | |
| 6,162,730 A | 12/2000 | Kai et al. | | |
| 6,230,720 B1 * | 5/2001 | Yalamanchili et al. | ....... | 134/1.3 |
| 6,248,651 B1 * | 6/2001 | Eng et al. | .................. | 438/558 |
| 6,443,817 B1 * | 9/2002 | McCarter et al. | ............. | 451/57 |
| 6,776,841 B2 | 8/2004 | Pyi | | |
| 2002/0004305 A1 * | 1/2002 | Vasat et al. | ................ | 438/690 |
| 2003/0060050 A1 | 3/2003 | Pietsch et al. | | |
| 2003/0134520 A1 | 7/2003 | Tachikawa et al. | | |
| 2003/0171075 A1 * | 9/2003 | Nihonmatsu et al. | ........ | 451/41 |
| 2004/0115941 A1 * | 6/2004 | Siebert et al. | .............. | 438/689 |
| 2005/0173377 A1 | 8/2005 | Pietsch et al. | | |

FOREIGN PATENT DOCUMENTS

| | | |
|---|---|---|
| DE | 10215960 A1 | 10/2002 |
| DE | 10237247 A1 | 3/2004 |
| DE | 102004005702 A1 | 9/2005 |
| EP | 1 049 145 A1 | 11/2000 |
| EP | 1049145 A1 | 11/2000 |
| EP | 1 378 946 A1 | 1/2004 |
| JP | 63081934 A | 4/1988 |
| JP | 11219926 A | 8/1999 |
| JP | 2001015459 A | 1/2001 |
| JP | 2001076981 A | 3/2001 |
| JP | 2002022901 A | 1/2002 |
| JP | 2004356252 A | 12/2004 |
| WO | 02/075816 A1 | 9/2002 |

OTHER PUBLICATIONS

English Patent Abstract of Japan JP2004 074792 A corresponding to DE10237247 A1.
Van Zant, Peter, "Microchip Fabrication," 4th Ed., Ch. 3, Publishing House of Electronics Industry, and English Abstract.

* cited by examiner

*Primary Examiner*—Robert M Kunemund
*Assistant Examiner*—Matthew J Song
(74) *Attorney, Agent, or Firm*—Brooks Kushman P.C.

(57) ABSTRACT

Unpolished semiconductor wafers are produced by: (a) pulling a single crystal of a semiconductor material, (b) grinding the single crystal round, (c) separating a semiconductor wafer from this crystal, (d) rounding the edge of the semiconductor wafer, (e) surface-grinding at least one side of the semiconductor wafer, (f) treating the semiconductor wafer with an etchant, and (g) cleaning the semiconductor wafer. The unpolished semiconductor wafers have, on at least the front side, a reflectivity of 95% or more, a surface roughness of 3 nm or less, have a thickness of 80-2500 µm, an overall planarity value GBIR of 5 µm or less with an edge exclusion of 3 mm and a photolithographic resolution of at least 0.8 µm, and which furthermore contain a native oxide layer with a thickness of 0.5-3 nm on both sides.

26 Claims, No Drawings

UNPOLISHED SEMICONDUCTOR WAFER AND METHOD FOR PRODUCING AN UNPOLISHED SEMICONDUCTOR WAFER

BACKGROUND OF THE INVENTION

1. Field of the Invention

The invention relates to an unpolished semiconductor wafer and to a method for producing an unpolished semiconductor wafer.

2. Background Art

According to the prior art, semiconductor wafers are produced in a multiplicity of successive process steps, which can generally be subdivided as follows:

a) production of a single crystal of semiconductor material (crystal pulling);
b) separation of the semiconductor single crystal into individual wafers (wafering, sawing);
c) mechanical processing of the semiconductor wafers;
d) chemical processing of the semiconductor wafers;
e) chemical-mechanical processing of the semiconductor wafers.

Added to this, there are a multiplicity of substeps such as cleaning, measuring and packaging.

A single crystal is conventionally produced by pulling a semiconductor single crystal from a melt (CZ or Czochralski method) or by recrystallizing a rod of polycrystalline semiconductor material (FZ or floating zone method).

Wire sawing (multi-wire slicing, MWS) and internal hole sawing are known as separating methods. In wire sawing, a multiplicity of semiconductor wafers are separated from a crystal piece in one working step. Wire saws have a wire web which is formed by the saw wire wound around two or more wire guide rolls. The saw wire may be coated with cutting grain (diamond wire MWS). When using wire saws with a saw wire without firmly bound cutting grain, cutting grain is supplied in the form of a suspension during the separation process (slurry MWS). The wire web, in which the saw wire is arranged in the form of wire sections lying parallel next to one another, penetrates through the crystal piece during the separation process. The penetration of the wire web is caused by a forward movement device, which guides the crystal piece against the wire web or the wire web against the crystal piece.

In internal hole sawing, a circularly round rotating saw blade which is clamped on its outer circumference in a clamp system, has a central circular bore (internal hole) whose inner circumferential region is provided with a cutting coat. The crystal piece to be cut is fastened in a frame by means of an adapter device and is brought by an adjustment mechanism into the intended cutting position and held there. The crystal and blade are subjected to relative motion by which the cutting edge works radially through the crystal piece until a semiconductor wafer is finally separated.

Mechanical processing serves to remove saw corrugations, to abrade surface layers which have suffered crystalline damage by the rough sawing processes or have been contaminated by the saw wire, and above all to provide for global planarization of the semiconductor wafers. Here, sequential single-side grinding (SSG) methods and simultaneous double-disk grinding (DDG) methods as well as lapping are used.

In single-side grinding, the semiconductor wafer is held on the rear by a support (chuck) and planarized on the front side by a cup grinding disk or, which is less customary, by an outer grinding disk with rotation of the support and the grinding disk and slow radial adjustment.

In simultaneous double-disk grinding (DDG), the freely suspended semiconductor wafer is simultaneously processed on both sides between two grinding disks mounted on opposite collinear spindles, while being guided substantially free from constraining forces axially between a water cushion (hydrostatic principle) or air cushion (aerostatic principle) acting on the front and rear sides, and loosely prevented from floating radially by means of a surrounding thin guide ring or by individual radial spokes.

Distinction can be made between coarse grinding and fine grinding depending on the granularity and binding of the abrasive grains of the grinding disks. In the scope of this invention, fine grinding means that grinding disks are used with synthetic resin-bonded abrasive with an average grain size of #1500 (mesh) or finer (larger mesh number). When coarse grinding is involved, this means a grinding step using grinding disks with average grain sizes of less than #1500. Such grinding disks are available, for example, from Disco Corp. Japan. The average grain size is specified according to Japanese Industrial Standard JIS R 6001:1998.

In lapping, while supplying a suspension containing abrasives, the semiconductor wafers are moved under pressure between upper and lower working disks, which usually consist of steel and are provided with channels for improved distribution of the lapping agent, semiconductor material thereby being removed. The semiconductor wafers lie in suitably dimensioned recesses of so-called rotor disks, the rotor disks being set in rotation by means of an inner and an outer drive rim and the semiconductor wafers thus being guided on a geometrical path determined by the drive parameters. The pressure is usually transmitted via a pneumatically, hydraulically or electrically operating force transmission device from the upper working disk onto the semiconductor wafers and the lapping agent lying between the working disks and the semiconductor wafers.

The edge of the semiconductor wafer, including any existing mechanical markings such as an orientation notch or an essentially rectilinear flat on the wafer edge, is usually also processed (edge notch grinding). To this end, conventional grinding steps with profiled grinding disks, belt grinding methods with continuous or periodic forward tool movement or integrated edge rounding methods (edge grinding and edge polishing in one step) are used.

The group of chemical processing steps comprises cleaning steps to remove contaminants, and etching steps to remove damaged surface layers and to reduce surface roughness. Etching steps with alkaline media, particularly those based on NaOH (sodium hydroxide), KOH (potassium hydroxide) or TMAH (tetramethylammonium hydroxide) and etching steps with acidic media, in particular based on mixtures of $HNO_3$/HF (nitric acid/hydrofluoric acid) or combinations of such etching steps, are employed for etching. Other etching methods such as plasma etching are occasionally also used.

The group of chemical-mechanical processing steps comprises polishing steps by which, through partial chemical reaction and partial mechanical material abrasion, the surface is smoothed with respect to local planarity, nanotopology and surface roughness, and residual damage of the surface is removed. Polishing generally comprises one or more prepolishing (material removal polishing) and haze-free (fine polishing) polishing steps and optionally also intermediate steps (buff polishing).

DE 10215960 A1 describes a method for producing semiconductor wafers, in which the following process sequence is employed:

a) separating a semiconductor single crystal into wafers, b) lapping the front and rear sides of the semiconductor wafers, c) etching the front and rear sides of the semiconductor wafers, d) fine grinding at least the front sides of the semiconductor wafers, e) etching the front and rear sides of the semiconductor wafers, f) polishing the semiconductor wafers.

During the production of semiconductor wafers for CMOS (Complementary Metal Oxide Semiconductor) applications, fine polishing of at least the front side of the semiconductor wafer as per step f) in DE 10215960 is provided by all known methods, in order to meet the stringent requirements for global and local planarity and nanotopology of starting materials for the production of these components. For the production of semiconductor wafers for applications in power electronics or for the fabrication of discrete components, however, these methods are too elaborate and uneconomical. Semiconductor wafers intended for such applications are therefore usually unpolished wafers which are lapped and treated with an etchant after separation from a single crystal. Polishing of the semiconductor wafers is not provided in this case. Attempts are made to achieve the planarity and gloss requirements of the semiconductor wafer merely by lapping and etching.

A method with a sawing-lapping-etching process sequence is also known, for example, from U.S. Pat. No. 6,063,301. A disadvantage of this method is that lapping leads to damage deep into the interior of the crystal lattice, which usually necessitates increased material removal during the subsequent etching in order to remove this damage. A high etch removal leads to a deterioration of the planarity of the semiconductor wafer.

A sawing-etching-lapping-etching sequence is described in U.S. Pat. No. 5,899,744. The material removal during lapping is intended to be reduced by carrying out a first etching treatment of the semiconductor wafer before the lapping step. This method is also disadvantageous, since further deterioration of the planarity of the semiconductor wafer is to be expected from two etching steps. An inferior surface roughness of the semiconductor wafers produced, namely less than 100 nm, is reported in all known methods in which a lapping step is provided.

It is proposed in DE 10237247 A1 to separate the semiconductor wafer from a single crystal, subject the semiconductor wafer to treatment with etchant, and subsequently clean the wafer, no further mechanical processing steps such as grinding, lapping or polishing being provided. A gloss-etched semiconductor wafer with a reflectivity of at least 70% can be produced by this method, the reflectivity is determined by projecting light onto the semiconductor wafer at a selected angle (40 to 80°) and measuring the reflected component. Semiconductor wafers with an unsatisfactory surface roughness of 0.1-0.5 µm are disclosed.

Another disadvantage of the foregoing method is that again, a high etching removal is provided, which entails a deterioration of the planarity or the microstructure of the surface of the wafer. This microstructure is distinguished by visually perceptible roughness variations over length scales of 50-2000 µm and is also known to those skilled in the art as an "orange peel" structure. Such a microstructure leads to a limitation of the possible linewidth in photolithographic processes during the production of components. This linewidth is the minimum distance between two objects of the overall component, for example the distance between the opposing edges of two interconnects.

SUMMARY OF THE INVENTION

It is therefore an object of the invention to improve the surface quality of unpolished semiconductor wafers and to permit smaller linewidths of components produced thereon. These and other objects are achieved by a method for producing an unpolished semiconductor wafer which comprises the following steps: (a) pulling a single crystal of a semiconductor material, (b) grinding the single crystal round, (c) separating a semiconductor wafer from this crystal, (d) rounding the edge of the semiconductor wafer, (e) surface-grinding at least one side of the semiconductor wafer, (f) treating the semiconductor wafer with an etchant, (g) finally cleaning the semiconductor wafer. The wafers thus produced are not processed further, but are packaged for shipping.

DETAILED DESCRIPTION OF THE PREFERRED EMBODIMENT(S)

According to step (a) of the method according to the invention, a single crystal of semiconductor material is first produced by the crystal pulling method, preferably by the FZ method, although the method is also equally suitable for CZ crystals. Silicon is preferably used as the semiconductor material, and the single crystals preferably have a 1-0-0, 1-1-0 or 1-1-1 crystal orientation.

The single crystal is preferably p- or n-doped and has a resistance of 0.001-100,000 Ohm·cm, with a resistance variation of less than ±10% in the axial and radial directions. The single crystal is preferably doped by adding a dopant to the single crystal during the pull. In the case of a p-doped single crystal, a 1-0-0 single crystal pulled by means of FZ is, for example, gassed with diborane during the pull, a resistance value of, for example, 50 Ohm·cm being achieved thereby.

Subsequently, according to step (b) of the method according to the invention, the single crystal is ground round according to the prior art. The diameter of the single crystal ground round is preferably 75-300 mm.

A semiconductor wafer is subsequently separated from the roundly ground single crystal according to step (c), preferably by means of a wire saw according to the prior art. Separation of the semiconductor wafer from the single crystal by an internal hole saw is also preferred. For the production of a semiconductor wafer with a thickness of 700 µm or more, separation of this semiconductor wafer by an internal hole saw is more economical and therefore particularly preferred over wire sawing.

The edge of the semiconductor wafer is subsequently rounded according to (d), and the edge of the wafer is preferably given a circular shape in cross section, which is usually characterized by two parameters: on the one hand by the circle radius and on the other hand by the angle which a tangent of the circle, at a point where the circle line intersects a line parallel to the surface of the semiconductor wafer, makes with that line.

At least the front side of the semiconductor wafer is subsequently ground according to step (e). The rear side of the semiconductor wafer is preferably also ground. After the grinding, the semiconductor wafer thus either has a ground front side and a sawed rear side or it is ground on both sides. The material abrasion during the grinding step is preferably selected so that surface damage caused by the separation of the semiconductor wafer from the single crystal is completely removed, and is preferably carried out sequentially when both sides are ground.

Simultaneous double-disk grinding (DDG) is also preferred. The grinding in this case respectively comprises two steps: coarse grinding, and subsequent fine grinding of one side (the front side) or both sides (front and rear sides) of the semiconductor wafer. Coarse grinding is preferably carried out by grinding disks with an abrasive grain size of #100-1000. Grinding disks with a grain size of #2000-8000 are preferably used for fine grinding.

Material removal during coarse grinding preferably lies in the range of 5-100 μm, more preferably in the range of 20-60 μm, on one side of the semiconductor wafer. During fine grinding, material removal is preferably in the range of 2-50 μm, more preferably in the range of 5-20 μm, on one side of the semiconductor wafer.

If the semiconductor wafer is separated by means of an internal hole saw in step (c), it is preferable to grind the semiconductor wafer on both sides in step (e). In contrast to wire sawing, if only the front side of a semiconductor wafer separated by means of an internal hole saw is ground, the greater crystalline damage lying below the rear surface of the wafer (subsurface damage) is not completely removed by the etchant. Residual damage thus remains on the rear side of the semiconductor wafer, which may lead to larger defects during component processing, particularly during thermal processing, and could therefore impair the function of the components, and in a worst case scenario, lead to their failure.

After surface grinding, the semiconductor wafer is treated with an etchant according to step (f) of the method according to the invention. Etching removes the subsurface damage remaining from the grinding step in the case of grinding the semiconductor wafer on both sides, and the subsurface damage remaining because of the grinding on one side and the sawing on the other side of the semiconductor wafer in the case of single-side grinding. The semiconductor wafer is preferably treated with an acidic etchant.

The material removal during treatment of the semiconductor wafer with the acidic etchant is preferably 5-100 μm on each side of the semiconductor wafer. A material removal of 10-20 μm on each side of the semiconductor wafer is preferred. The etching step is preferably carried out with a mixture of $HF/HNO_3$ (hydrofluoric acid/nitric acid). $HF/HNO_3$ is particularly well suited for removing metallic contaminations caused by previous mechanical processing steps (wire sawing, grinding) from the surface of the semiconductor wafer.

Washing steps with distilled water, wet chemical hydrophilization preferably carried out by means of $H_2O/O_3$ (water/ozone) and a drying step are furthermore preferred in the scope of step (f). Hydrophilization is preferably carried out by a gas phase, by means of $O_3$ gassing after drying the semiconductor wafer. Native oxide is formed on both sides of the semiconductor wafer by the hydrophilization, so that the surface of the semiconductor wafer is sealed and the risk of creating impressions during subsequent contact with handling equipment is reduced. This native oxide layer is preferably 0.5-3 nm thick.

A measurement of planarity parameters (for example global planarity GBIR) and the thickness of the semiconductor wafer is preferably carried out after the treatment of the semiconductor wafer with the etchant according to (f). It is furthermore preferable to determine bulk resistance values of the semiconductor wafer, which has the advantage that a semiconductor wafer which does not lie in a determined tolerance range with respect to its planarity and/or its resistance can be rejected. It is furthermore preferable to segregate the semiconductor wafers into groups with a particular resistance and/or a defined thickness.

Contact of the semiconductor wafer to be analyzed with the material of the carrier transporting the semiconductor wafer (typically polyurethane, for example) occurs during the measurement or handling of the semiconductor wafer, and despite the hydrophilicity of the surfaces of the semiconductor wafer, some contamination of the semiconductor wafer cannot be ruled out, for example in the form of an impression on the semiconductor wafer (for example of a conveyor belt or a chuck, i.e. a support suitable for holding a semiconductor wafer), in the form of particles, or else as metallic contamination (primarily by direct contact with a conveyor belt), or by cross-contamination by contact with an uncleaned, and still contaminated surface from a previous measurement process. A subsequent cleaning step to remove particles and impressions on the semiconductor wafer is necessary after the measurements have been conducted. A final cleaning of the semiconductor wafer is therefore carried out in step (g) of the method according to the invention.

The final cleaning preferably involves a sequence of: cleaning the semiconductor wafer in baths of surfactants; washing; treatment in aqueous HF solution (optionally with $O_3$) to remove metallic contaminants; further hydrophilicization, which is carried out either wet chemically or by gassing; and drying the semiconductor wafer.

The treatment in aqueous HF solution removes metallic contaminants, which may be caused by previous measurements and by handling equipment, from the surfaces of the semiconductor wafer. The concentration of the aqueous HF solution is preferably 0.2-5%.

In order to be able to identify visually perceptible defects and reject a semiconductor wafer having such defects, a visual inspection of the semiconductor wafer is preferably carried out after the final cleaning. The semiconductor wafer can subsequently be packaged and prepared for dispatch.

A particular advantage of the method according to the invention is that it is a less expensive method than the prior art methods of producing a polished semiconductor wafer, but a surface quality of the semiconductor wafer produced thereby which corresponds essentially to that of a polished semiconductor wafer is nevertheless achieved. This result is achieved according to the invention by replacing the hitherto customary lapping by a grinding step.

The semiconductor wafer produced by the method according to the invention has a surface roughness of 3 nm or less on its at least one ground and etched side, which represents a significant improvement over the prior art of a "sawn, lapped and etched semiconductor wafer" (roughness 100 nm or more).

A relatively low etching removal is required in the inventive method compared to the prior art method for a sawed, lapped and etched semiconductor wafer, the effect of which is to avoid deterioration of the microstructure of the semiconductor wafer due to significantly high etching removal ("orange peel"). At the same time, planarity parameters are achieved which are better than the prior art of a "sawn, lapped and etched semiconductor wafer".

Furthermore, it is also possible to produce thin semiconductor wafers with a thickness of 80-100 μm by the method according to the invention, which is not possible with a sawing-lapping-etching process sequence according to the prior art.

Thus, one embodiment of the invention pertains to an unpolished semiconductor wafer having a front side and a rear side, wherein at least its front side is ground and its front and rear sides are etched, which has a reflectivity of 95% or more at least on its front side, a surface roughness of 3 nm or less at least on its front side, a thickness of 80-2500 µm, a global planarity value GBIR of 5 µm or less, based on an edge exclusion of 3 mm, which has a photolithographic resolution of up to 0.8 µm, and which furthermore contains a native oxide layer with a thickness of 0.5-3 nm respectively on its front and rear sides.

The thickness of the semiconductor wafer corresponds to the respective requirements for the device process, and is preferably 100-500 µm. The global planarity value GBIR is preferably 0.5-3 µm. The semiconductor wafer is preferably a monocrystalline silicon wafer.

The global planarity relates to the entire surface of the semiconductor wafer less a defined edge exclusion, and is described by a global planarity value GBIR (global backsurface-referenced ideal plane/range=magnitude of the positive and negative deviation from a backsurface-referenced ideal plane for the entire front side of the semiconductor wafer), which corresponds to the previously customary specification TTV (total thickness variation).

The photolithographic resolution of at least 0.8 µm is intended to mean that the semiconductor wafer according to the invention is suitable for the production of electronic devices with linewidths of at least 0.8 µm by means of photolithography.

The semiconductor wafer according to the invention preferably has a reflectivity of 98% or more, at least on its front side, and preferably has no damage, craters, plastic residue or other defects that can be identified by means of a visual inspection. Furthermore, it is preferable that no particles are visible on the semiconductor wafer under visual observation with collimated light. The rear side of the semiconductor wafer is preferably likewise ground and etched.

The semiconductor wafer according to the invention furthermore preferably has $10^{13}$ cm$^{-2}$ or less, preferably $5 \cdot 10^8$-$10^{13}$ cm$^{-2}$ of metallic contaminations with measurement by means of VPD-TXRF (vapor phase decomposition-total reflection X-ray fluorescence analysis) or VPD-ICP-MS (inductively coupled plasma with quadrupole mass spectrometer). The metal contaminations which are preferably limited, are those of copper, nickel or calcium.

The semiconductor wafer is preferably of the p or n conduction type and has a 1-0-0, 1-1-0 or 1-1-1 crystal orientation in its bulk, a resistance range of 0.001-100,000 Ohm·cm and a resistance tolerance of less than ±10%.

The 0.5-3 nm thickness of the native oxide is preferably measured on the semiconductor wafer according to the invention by means of ellipsometry.

The semiconductor wafer preferably has a circular shape of its edge in cross section, which is characterized on the one hand by the circle radius and on the other hand by an angle which a tangent of the circle, at a point where the circle line intersects a line parallel to the surface of the semiconductor wafer, makes with that line:

EXAMPLE

The following process parameters were selected for the production of semiconductor wafers:

A single crystal was wire sawn to provide wafers of a thickness of 425 µm, followed by grinding abrasion 50 µm per side, of which 30 µm is achieved by coarse grinding and 20 µm by fine grinding. Etching treatment with a material removal of 12.5 µm per side, then followed, providing semiconductor wafers with the following parameters: GBIR 1.5 µm±1 µm; Thickness 300 µm±10 µm; Reflectivity: 99%±0.7%; Short-range surface roughness, measured by means of AFM (atomic force microscope), length scales up to 50 µm: 3 nm±1 nm; Long-range surface roughness (on length scales up to 2 mm): 30 nm±3 nm (orange peel); and Edge shape: edge circle radius of 150 µm and a tangent angle of 32°.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing an unpolished semiconductor wafer, which comprises the following steps, in the order given: (a) pulling a single crystal of a semiconductor material, (b) grinding the single crystal round, (c) separating a semiconductor wafer from this crystal, (d) rounding the edge of the semiconductor wafer, (e) surface-grinding both sides of the semiconductor wafer by a first coarse grinding followed by a second fine grinding, (f) treating the semiconductor wafer with an etchant, and (g) cleaning the semiconductor wafer, wherein the unpolished wafer has a front side and a rear side, wherein at least its front side is ground and its front and rear sides are etched, which has a reflectivity of 95% or more at least on its front side, a surface roughness of 3 nm or less at least on its front side, a thickness of 80-2500 µm, a global planarity value GBIR of 5 µm or less based on an edge exclusion of 3 mm and which allows a photolithographic resolution of at least 0.8 µm, and which furthermore contains a native oxide layer with a thickness of 0.5-3 nm on its front and rear sides.

2. The method of claim 1, wherein the single crystal according to (a) is pulled by the FZ method.

3. The method of claim 1, wherein the single crystal according to (a) is pulled by CZ method.

4. The method of claim 1, wherein the crystal has a 1-0-0, 1-1-0 or 1-1-1 crystal orientation and silicon is used as the semiconductor material.

5. The method of claim 1, wherein a dopant is added to the single crystal during the pull.

6. The method of claim 1, wherein the diameter of the single crystal after grinding round is 75-300 mm.

7. The method of claim 1, wherein the separation of the semiconductor wafer from the single crystal according to (c) is carried out by means of a wire saw.

8. The method of claim 1, wherein the separation of the semiconductor wafer from the single crystal is carried out with an internal hole saw.

9. The method of claim 1, wherein the surface grinding according to (e) comprises coarse grinding by grinding disks having a grain size of #100-1000 (mesh) with material abrasion of 5-100 µm, and fine grinding by grinding disks having a grain size of #2000-8000 (mesh) and a material abrasion of 2-50 µm.

10. The method of claim 9, wherein the material abrasion is 20-60 µm in the coarse grinding and 5-20 µm in the fine grinding.

11. The method of claim 1, wherein both the front and rear sides of the semiconductor wafer are ground in the surface grinding of the semiconductor wafer according to (e).

12. The method of claim 11, wherein the surface grinding of the semiconductor wafer is carried out sequentially.

13. The method of claim 11, wherein the surface grinding of the semiconductor wafer is carried out simultaneously on both sides.

14. The method of claim 1, wherein an acid etchant is used in the treatment of the semiconductor wafer according to (f), and a material removal during etching is 5-100 μm.

15. The method of claim 14, wherein the material removal is 10-20 μm.

16. The method of claim 14, wherein a mixture of $HF/HNO_3$ is used as the etchant.

17. The method of claim 14, wherein step (f) furthermore comprises washing steps with distilled water, wet chemical hydrophilization of the semiconductor wafer, and a drying step.

18. The method of claim 17, wherein the hydrophilization is carried out by means of $O_3$ gassing after drying the semiconductor wafer.

19. The method of claim 1, wherein a measurement of planarity parameters and the thickness of the semiconductor wafer as well as a determination of bulk resistance values are carried out after the treatment of the semiconductor wafer with the etchant according to (f).

20. The method of claim 19, wherein the semiconductor wafer is rejected if it does not lie in a determined tolerance range with respect to its planarity or its resistance.

21. The method of claim 19, wherein the semiconductor wafer is calibrated into a group with a particular resistance.

22. The method of claim 19, wherein the semiconductor wafer is calibrated into a group with a particular thickness.

23. The method of claim 1, wherein the final cleaning of the semiconductor wafer according to (g) comprises cleaning the semiconductor in a bath containing surfactant, washing, treatment in aqueous HF solution, hydrophilization carried out either wet chemically or by gassing, and drying the semiconductor wafer.

24. The method of claim 1, wherein a visual inspection of the semiconductor wafer is carried out after the final cleaning of the semiconductor wafer according to (g).

25. A method for producing an unpolished semiconductor wafer, which consists of the following steps, in the order given: (a) pulling a single crystal of a semiconductor material, (b) grinding the single crystal round, (c) separating a semiconductor wafer from this crystal, (d) rounding the edge of the semiconductor wafer, (e) surface-grinding both sides of the semiconductor wafer by a first coarse grinding followed by a second fine grinding, (f) treating the semiconductor wafer with an etchant and optionally one or more steps of washing with water, wet chemical hydrophilization, and drying, wherein the unpolished wafer has a front side and a rear side, wherein at least its front side is ground and its front and rear sides are etched, which has a reflectivity of 95% or more at least on its front side, a surface roughness of 3 nm or less at least on its front side, a thickness of 80-2500 μm, a global planarity value GBIR of 5 μm or less based on an edge exclusion of 3 mm and which allows a photolithographic resolution of at least 0.8 μm, and which furthermore contains a native oxide layer with a thickness of 0.5-3 nm on its front and rear sides.

26. A method for producing an unpolished semiconductor wafer, which comprises the following steps, in the order given: (a) pulling a single crystal of a semiconductor material, (b) grinding the single crystal round, (c) separating a semiconductor wafer from this crystal, (d) rounding the edge of the semiconductor wafer, (e) surface-grinding both sides of the semiconductor wafer by a first coarse grinding followed by a second fine grinding, (f) treating the semiconductor wafer with an etchant, (g) cleaning the semiconductor wafer, and (h) packaging the unpolished wafers for dispatch, optionally preceded by inspection, wherein the unpolished wafer has a front side and a rear side, wherein at least its front side is ground and its front and rear sides are etched, which has a reflectivity of 95% or more at least on its front side, a surface roughness of 3 nm or less at least on its front side, a thickness of 80-2500 μm, a global planarity value GBIR of 5 μm or less based on an edge exclusion of 3 mm and which allows a photolithographic resolution of at least 0.8 μm, and which furthermore contains a native oxide layer with a thickness of 0.5-3 nm on its front and rear sides.

* * * * *